US009129315B2

(12) United States Patent
Rentería Villagómez et al.

(10) Patent No.: US 9,129,315 B2
(45) Date of Patent: Sep. 8, 2015

(54) BILL FOLDER WITH VISUAL DEVICE AND DYNAMIC INFORMATION CONTENT UPDATING SYSTEM

(76) Inventors: Alejandro Rentería Villagómez, Del Magdalena Contreras (MX); Juan Antonio Andrade Gress, Del Tlalpan (MX); Jorge Luis Oceguera Ruiz, Del Tlalpan (MX); Salvador Felipe Aguirre Rios, Del Tlalpan (MX)

( * ) Notice: Subject to any disclaimer, the term of this patent is extended or adjusted under 35 U.S.C. 154(b) by 597 days.

(21) Appl. No.: 13/443,194

(22) Filed: Apr. 10, 2012

(65) Prior Publication Data

US 2012/0194985 A1 Aug. 2, 2012

Related U.S. Application Data

(63) Continuation of application No. PCT/IB2010/000783, filed on Apr. 10, 2010.

(51) Int. Cl.

| | |
|---|---|
| ***H05K 5/00*** | (2006.01) |
| ***H05K 7/00*** | (2006.01) |
| ***G06Q 30/04*** | (2012.01) |
| ***G06Q 50/12*** | (2012.01) |

(52) U.S. Cl.

CPC ................ *G06Q 30/04* (2013.01); *G06Q 50/12* (2013.01)

(58) Field of Classification Search

CPC ........................... G06F 1/33225; G06F 1/1616

USPC ............... 361/679.01–679.09, 679.1–679.19, 361/679.31–679.45, 679.55–679.6, 361/724–747; 248/80–88, 155.1–155.5, 248/166–173, 180.1–186.2, 229.1–231.51, 248/271.4, 292.14, 316.1–316.8

See application file for complete search history.

(56) References Cited

U.S. PATENT DOCUMENTS

2005/0219223 A1* 10/2005 Kotzin et al. ................. 345/173
2007/0215695 A1* 9/2007 Trane ............................ 235/380
2007/0253187 A1* 11/2007 Cohan et al. .................... 362/98

* cited by examiner

*Primary Examiner* — Jerry Wu

(74) *Attorney, Agent, or Firm* — Anderson Gorecki & Rouille LLP

(57) ABSTRACT

A bill folder for providing a user with relevant information when paying for a service such as in a restaurant, hotel, etc., in which said bill folder comprises a first portion that has a coating and one or more holding elements, and a second portion that has a coating and one or more holding elements, in which both portions are joined by an intermediate hinged portion that forms a spine. The first portion contains a first enclosure and includes at least one visual device, and the first enclosure contains a motherboard, the second portion contains a second enclosure, in which the at least one visual device is able to display dynamic information obtained from a content updating system. The present invention overcomes the technical problem of integrating an information content updating system dynamically and in a manner suitable to all locations, orders, levels and types of service.

18 Claims, 17 Drawing Sheets

BILL FOLDER WITH VISUAL DEVICE AND DYNAMIC INFORMATION CONTENT UPDATING SYSTEM

CROSS-REFERENCE TO RELATED APPLICATIONS

This application is a continuation of International Application PCT/182010/000783.

TECHNICAL FIELD OF THE INVENTION

The present invention relates to the technological field of electronics in conjunction with network computer systems. Particularly, this invention comprises an improved bill folder with one or more visual devices and a system that allows dynamic information contents updating to a user.

BACKGROUND OF THE INVENTION

Bill folder devices are commonly known, also identified as a billfold or payment folder, wherein a service provider presents the bill or payment stub with the full account of the service to a customer. For example, some of these services may include restaurants, bars, hotels, and many others. There are some bill folder devices in the State of the Art that include some improvements whose primary purpose is to facilitate the processing and collection of the bill settlement.

An improved bill folder is described in US patent application US2005/0046172 that includes inside a plurality of compartments configured to accommodate a plurality of cards, debit or credit, together with a built-in calculator in the same folder to facilitate customer calculation of the bill. Similarly, U.S. Pat. No. 6,076,079 protects a calculator with a display adapted for tip calculation; wherein said calculator is coupled to a bill folder or payment folder. Further to the electronics usually used in a calculator, the bill folders described in both documents do not exhibit further improvements in the electronics field or integration to information systems.

Moreover, U.S. Pat. No. 6,050,214 protects a bill folder device that presents a tab type visual indicator which slides on two or more colored areas that allow the service provider to know the payment status of the customer. However, this simple invention does not involve electronic components, which in conjunction with information systems facilitate the payment procedures. Similarly, U.S. Pat. No. 5,355,115 shows a bill folder with colored flags type signals, wherein each color indicates to the service provider a payment status of the service bill. In this patent, a lightning control circuit for the flag signal that improves viewing, as well as electronic elements are incorporated. However, this bill folder excludes information systems integration. Also, U.S. Pat. No. 6,796,673 protects a bill folder wherein a lighting signal is turned on by the user to indicate that the service provider may collect the bill folder. Once again, although this invention includes electronic components for lighting and signaling, this does not include information systems integration.

There are other numerous bill folder devices directed to solve the problem of bill or payment stub viewing per se at the time the service provider is presenting it to the customer. For example, U.S. Pat. Nos. 6,409,357, 6,808,208, 7,163,307, 7,270,437, and 7,277,241, describe payment folders with illumination means on the area holding the pay stub or bill. U.S. Pat. Nos. 6,808,208 and 7,270,437 also combine the use of lens or magnifying glass to facilitate reading the customer's bill. Moreover, U.S. Pat. Nos. 6,409,357 and 7,163,307, and U.S. patent application no. US2002/0093813 use sensors that detect the opening of the bill folder and automatically turn on the illumination means.

Additionally, the State of the Art include other bill folder devices which include illumination applied for advertising purposes, such as those described in U.S. patent application 2007/0115650, and in U.S. Pat. No. 5,813,748. Both inventions describe and illustrate in the exterior and interior of the device one or more panels, illuminated from inside or backlit. The function of these panels is to function as an advertising display or showcase to display any advertising sign, logo, or image. In both documents, the panels are limited to show a single image statically. None of these documents suggests an integration of information systems to improve the content presented to the customer in the panels.

Also, U.S. patent application no. US2007/0215695 describes a device and system to present and facilitate the settlement of a restaurant bill. This device is embedded into a bill folder, and has an input and display touch screen, a magnetic card reader to enter payment information, and a system with a memory means to execute computer instructions, a processing unit of computer instructions, additional optional memory means, input devices, output devices, and communication links, which can be wired or wireless. The disadvantage of this bill folder is that it is directed exclusively to present payment information and not any other information that may be useful to the customer. Additionally, another disadvantage is that both the tactile and the magnetic card reader are directed to solving the payment problem through data entry which processing is complicated, requires high security connections and authentication processes with financial institutions whose data processing is more complex. Moreover, this device lacks of means for indicating when the device is in use, which will optimize the use of the battery. Moreover, this device also lacks of means for adjusting the information display device automatically under light conditions at the site. Still further, this device has the disadvantage of lacking a mechanism to detect if the device leaves the location area without authorization, such as in case of theft. Finally, this patent document also discloses the charging means for this device.

Finally, U.S. patent application no. US2002/0194072 describes a device exclusively oriented to perform customer satisfaction surveys. The document describes a device with calculator and data input means allowing the user to introduce the survey responses. Moreover, the document states that these devices can be charged into a base, wherein at the same time extracts the survey data. The disadvantage of this document is that the device does not permit nor considers displaying information of other nature that can be useful to the customer. Moreover, this device lacks of means for indicating when the device is in use, which will optimize the use of the battery. Still further, this device also lacks of means for adjusting the information display device automatically under light conditions at the site. Finally, this device has the disadvantage of lacking a mechanism to detect if the device leaves the location area without authorization, such as in case of theft.

Therefore, there is a need in the prior art for a bill folder or check bill presenter to facilitate the interaction of dynamic information content relevant to a customer during a service payment process. Likewise, the present invention solves the technical problem of integrating a dynamic information content system to a bill folder by electronic components that allow to interact, to optimize energy use and to maintain safe the bill folder.

OBJECT OF THE INVENTION

The main aspect of the present invention is to provide a bill folder that facilitates relevant information to the customer during a service payment process.

Another aspect of the present invention is to solve the technical problem of integrating a remote or in situ content updating system in said bill folder.

Moreover, another aspect is to display this information in a dynamic manner and tailored to each location, regime, level, and type of service.

Finally, another aspects are the customer interaction, energy use optimization, and keeping safe the bill folder.

BRIEF DESCRIPTION OF THE DRAWINGS

To provide a better understanding of the process of the invention the following drawings are annexed.

To facilitate understanding of the present invention, Table 1 lists reference numbers, and the elements and steps which are mentioned in the figures.

TABLE 1

Reference numbers

| Elements | Reference numbers |
|---|---|
| Bill folder | 10 |
| First portion | 20 |
| Lid | 21 |
| Cover | 22 |
| Holding elements | 23 |
| Spine | 25 |
| Second portion | 30 |
| Counter-lid | 31 |
| Counter-cover | 32 |
| Holding elements | 33 |
| Gasket | 40 |
| Coupling means | 45 |
| First enclosure | 50 |
| Front lid | 51 |
| Damping material | 52 |
| Damping material | 53 |
| First visual device | 55 |
| Visual device housing | 56, 66 |
| Printed circuit board or PCB for visual device | 57, 67 |
| Flat wire connector | 58, 68 |
| Connector | 59, 69 |
| Back lid | 61 |
| Damping material | 62 |
| Damping material | 63 |
| Second visual device | 65 |
| Motherboard | 70 |
| Processor | 75 |
| Service port | 79 |
| Second enclosure | 80 |
| Base | 81 |
| Battery | 82 |
| Opening sensor | 83 |
| Charged terminals | 84 |
| Charger | 90 |
| Charger housing | 91 |
| Charger assembly | 92 |
| Charging slot | 93 |
| Charging terminals | 94 |
| Power source | 95 |
| Printed circuit board or PCB for charger | 96 |
| Content updating system | 100 |
| Content server | 110 |
| Internet | 120 |
| Point of access | 130 |
| Data connection | 140 |
| Real Time Clock (RTC) | 205 |
| Independent supply | 206 |
| DC/DC converter | 210 |
| Battery charger | 211 |
| USB interface | 221 |
| Removable USB | 222 |
| Memory card interface | 223 |
| Removable memory card | 224 |
| Communication service interface | 225 |
| Accelerometer | 231 |
| Vibration sensor | 232 |
| Light sensor | 233 |
| Wireless transmission interface | 241 |
| Radio interface | 242 |
| Exiting idle state | 301 |
| Connecting with content server | 302 |
| Receiving dynamic information from server | 303 |

TABLE 1-continued

| Reference numbers | |
|---|---|
| Elements | Reference numbers |
| Deleting previous dynamic information from corresponding memory | 304 |
| Overwriting received dynamic information in corresponding memory | 305 |
| Entering idle state | 306 |
| Exiting idle state | 311 |
| Connecting to the corresponding interface | 312 |
| Entering idle state | 313 |

DETAILED DESCRIPTION OF THE INVENTION

Figure 1:
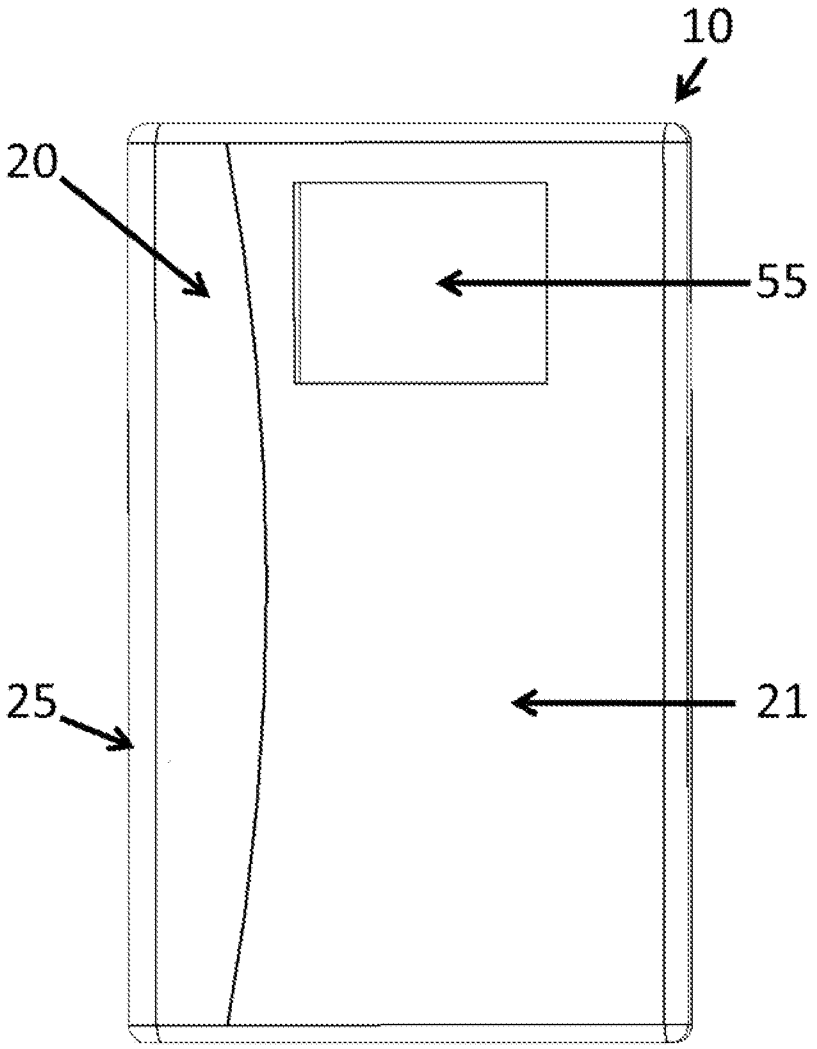
FIG. 1 shows a front view of the bill folder in a closed position in accordance with the preferred embodiment of the present invention.
Figure 2:
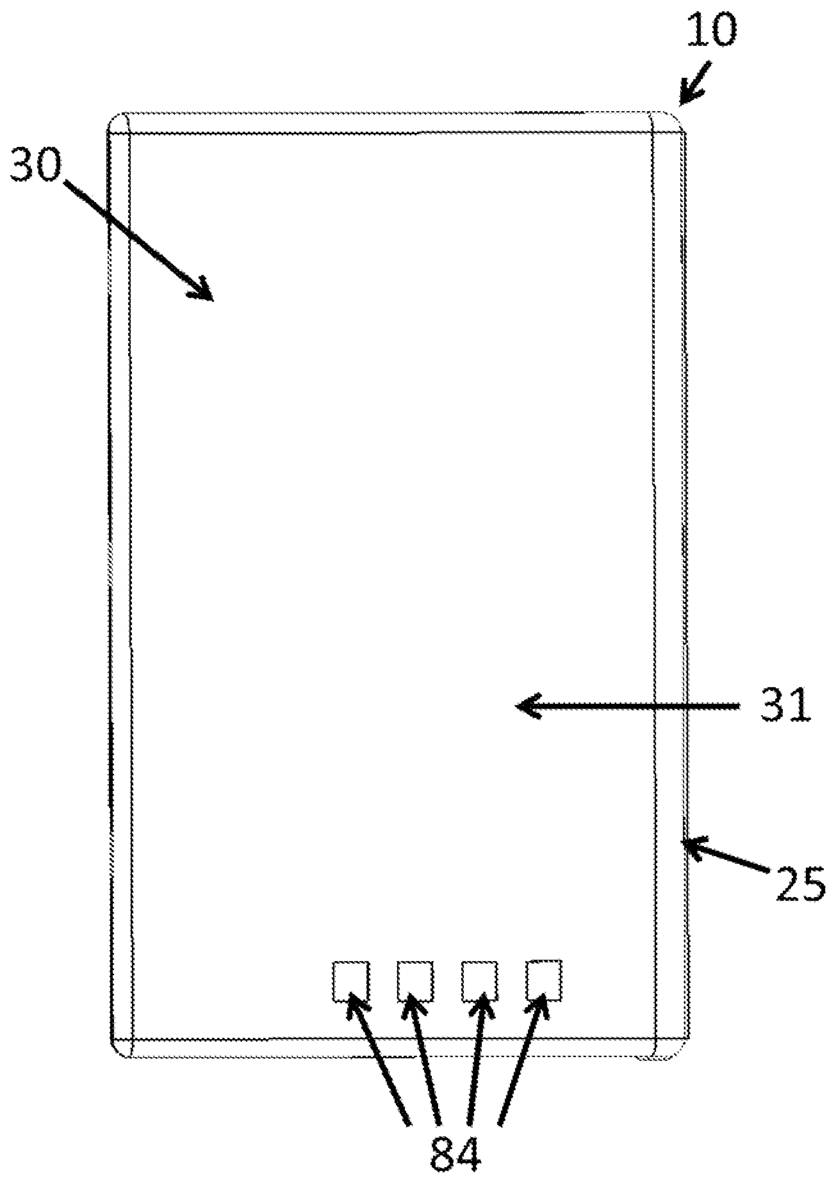
FIG. 2 shows a rear view of the bill folder in a closed position in accordance with the preferred embodiment of the present invention.
Figure 3:
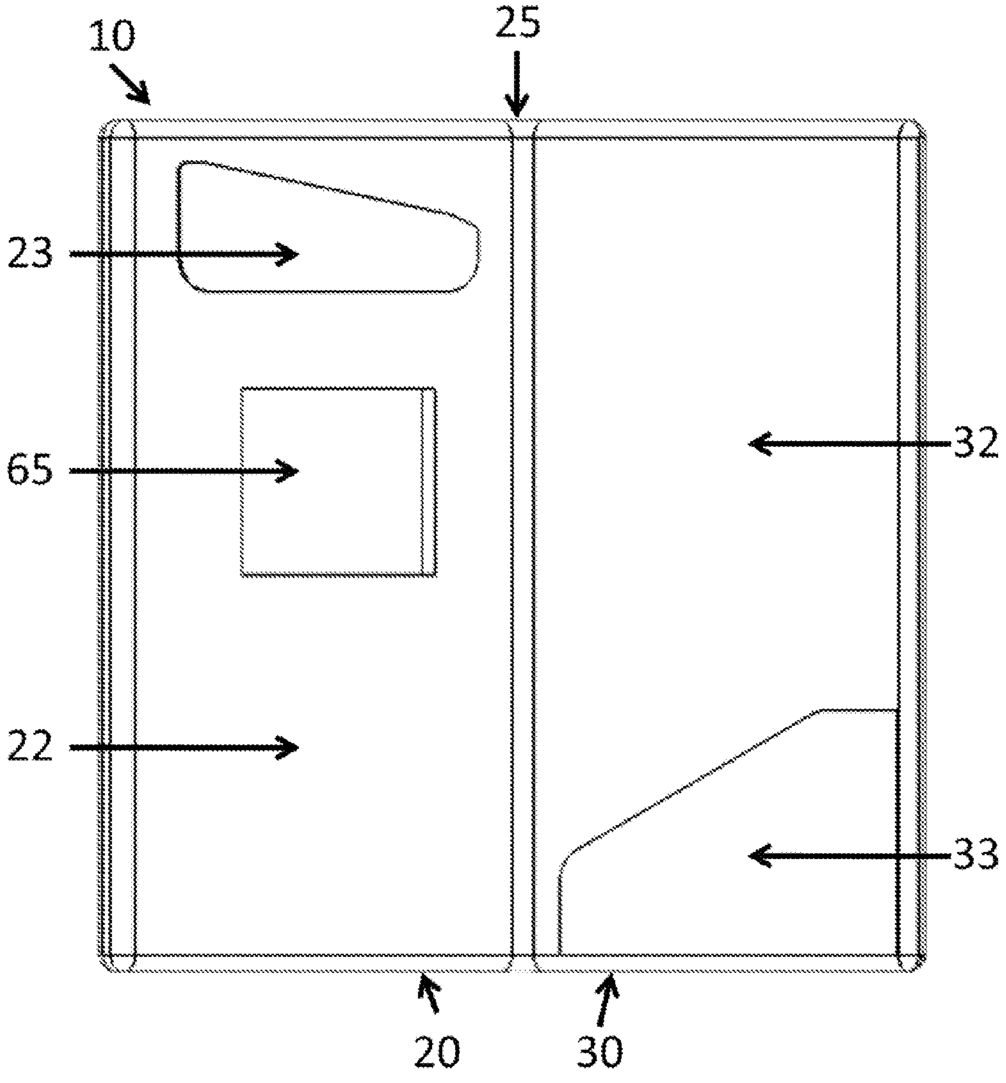
FIG. 3 shows a right front perspective view of the bill folder in an open position in accordance with the preferred embodiment of the present invention.

FIGS. 1 to 3 illustrate the preferred embodiment of a bill folder (10) of the present invention comprising a first portion (20) and a second portion (30) coupled by an intermediate hinged portion that forms a spine (25) of the bill folder. FIG. 1 illustrates the first portion (20) comprising a lid (21) and a first visual device (55) whose components and operation will be explained later. FIG. 2 illustrates the second portion (30) comprising a counter-lid (31) and one or more terminals (84) whose components and operation will be explained later.

FIG. 3 shows the bill folder (10) in an open position exposing the interior of both portions (20) and (30). The first portion (20) comprises a cover (22), one or more holding elements (23) and a second visual device (65) whose components and operation will be explained later. In turn, the second portion (30) comprises a counter-cover (32) and one or more holding elements (33). The holding elements (23) and (33) are formed from material portions joined by a portion of its contour perimeter to the cover (22) and counter-cover (32), respectively, while the other part of its contour perimeter is left without joining, in a superimposed manner. These holding elements (23) and (33) allow partially holding pay stubs, invoices, payment card, bills, checks, pen, and other items related to the service that can be partially held. Preferably, the portions (20) and (30) have a coating of leather or materials with similar appearance. Note that, in an alternative embodiment, the visual device (55, 56) can also be located in the second portion (30).

Figure 4:
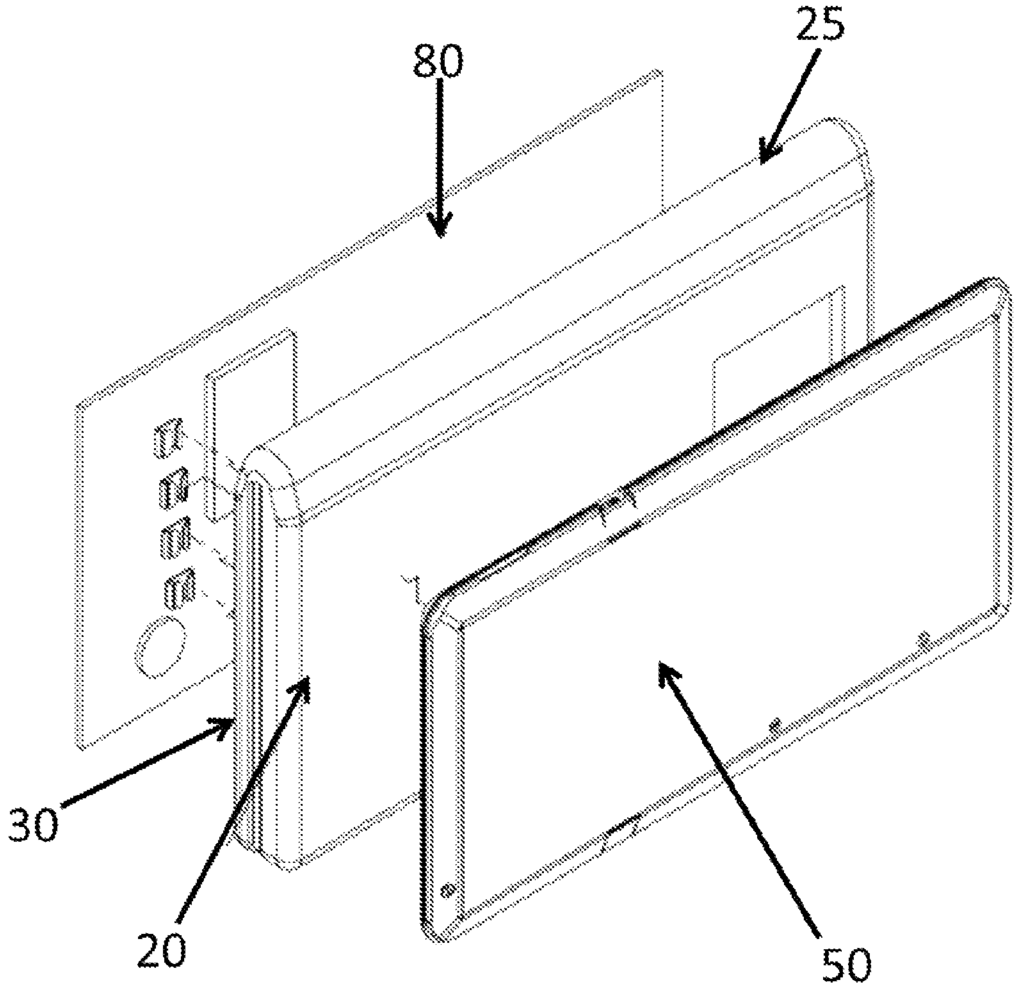
FIG. 4 shows an exploded view in left front bottom perspective of the bill folder in accordance with the preferred embodiment of the present invention.

Now, FIG. 4 shows an exploded view of the bill folder (10) showing a first enclosure (50), which is housed inside the first portion (20), and a second enclosure (80), which is housed inside the second portion (30). Note that, in an alternative embodiment, enclosures (50, 80) can be located in any of the portions (20, 30).

Figure 5:
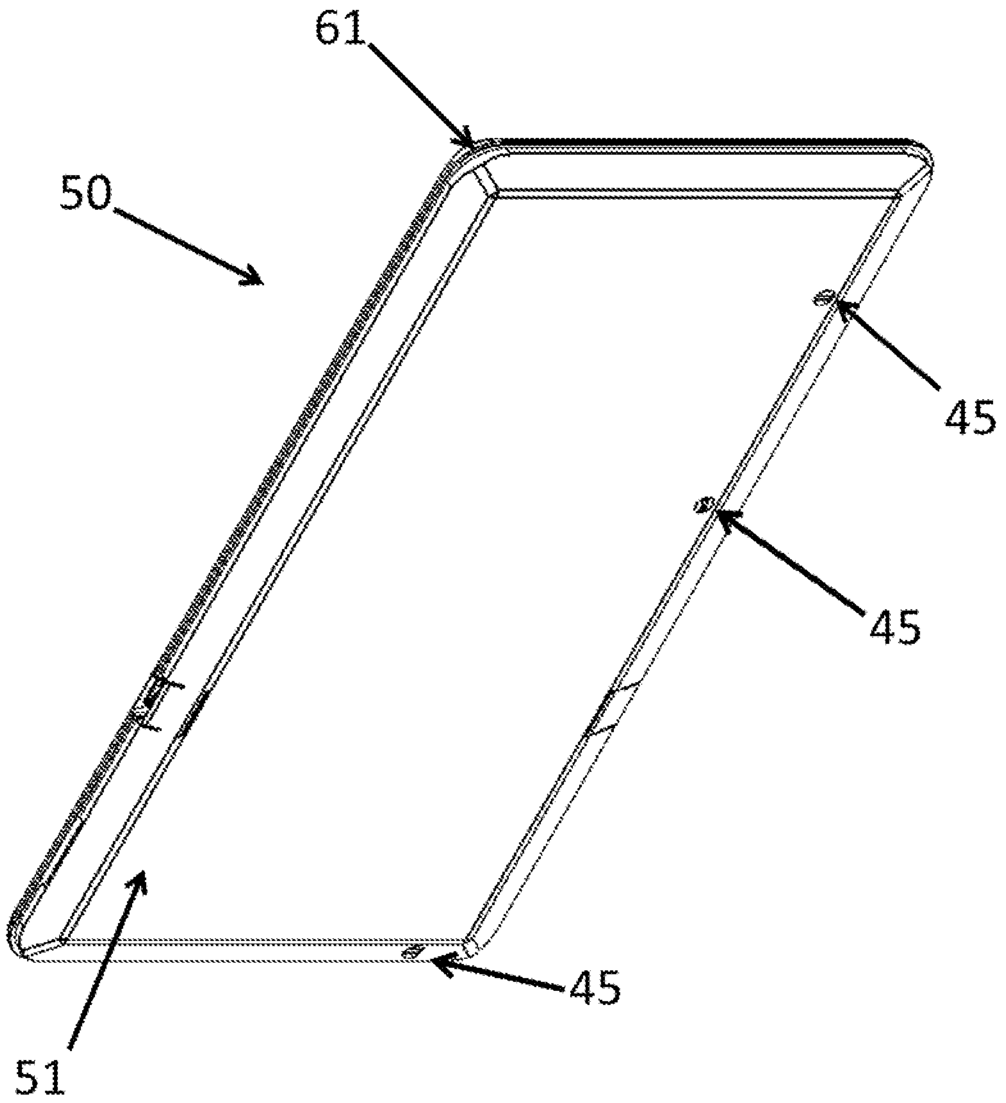
FIG. 5 shows a left front perspective view of the first enclosure of the bill folder in accordance with the preferred embodiment of the present invention.

As shown in FIG. 5, the first enclosure (50) comprises an assembly of electronic components housed inside a housing formed by a transparent front lid (51) and a transparent back lid (61), joined by suitable known coupling means (45). In this figure, coupling means (45) are illustrated as screws; however, coupling means (45) may be rivets, glue, resin, plastic elements, pins, staples, etc. In the preferred embodiment of the invention, the lids (51) and (61) are divided into three sections: upper, middle and lower. The size of each section is suitable for accommodating electronic components.

Figure 6:
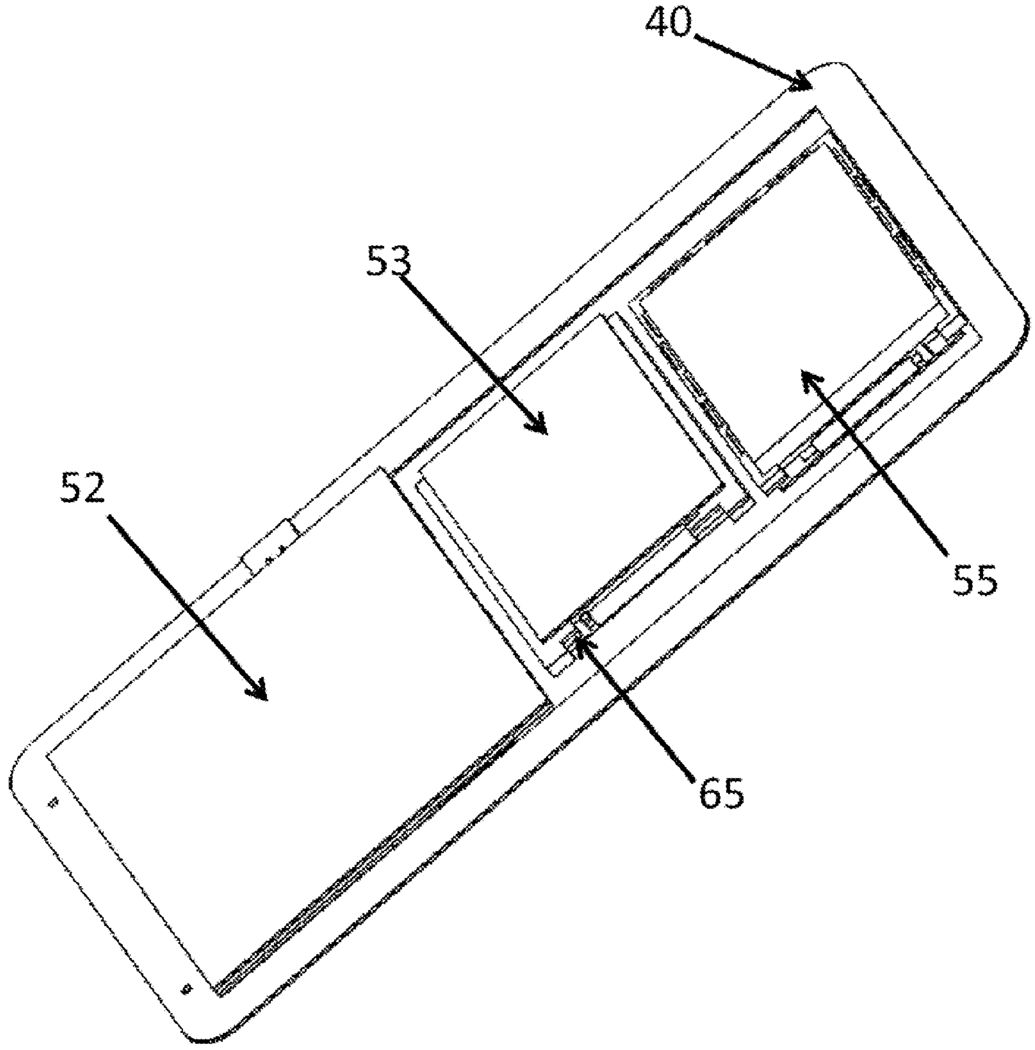
FIG. 6 shows a right front perspective view of the assembly housed within the first enclosure of the bill folder in accordance with the preferred embodiment of the present invention.
Figure 7:
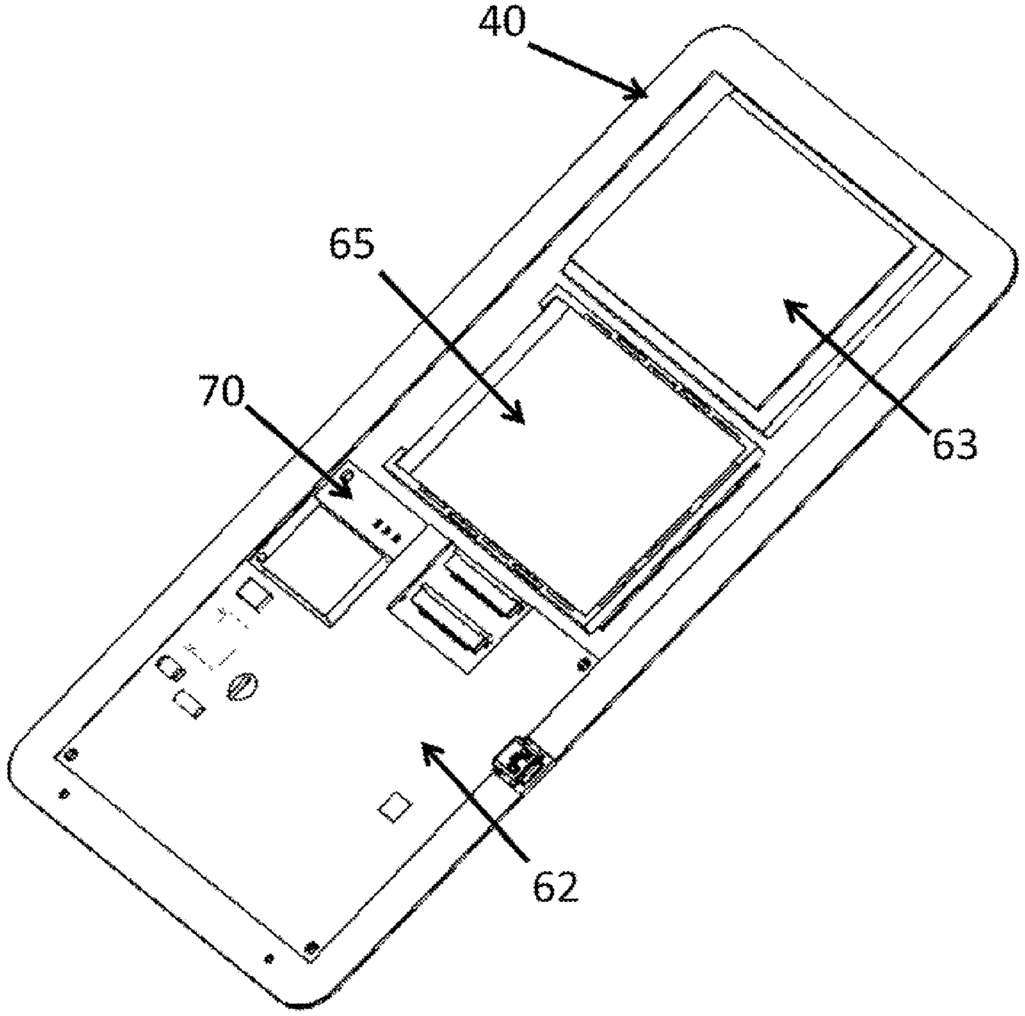
FIG. 7 shows a left rear perspective view of the assembly housed within the first enclosure of the bill folder in accordance with the preferred embodiment of the present invention.

FIGS. 6 and 7 show the assembly of electronic components illustrated without lids (51) and (61). A gasket (40) is placed between the two lids to seal the first enclosure (50). A motherboard (70) is housed between the lower sections of the lids (51) and (61). Damping material sheets (52) and (62) are placed between the two lids (51) and (61) and the motherboard (70), respectively. The first visual device (55) is housed between the upper sections of the lids (51) and (61). Similarly, a damping material sheet (53) is placed between the back lid (61) and the first visual device (55), while the first visual device (55) is easily observable through the transparent front lid (51). The second visual device (65) is housed between the middle sections of the lids (51) and (61). In the same manner, a damping material sheet (63) is placed between the front lid (51) and the second visual device (65), while the second visual device (65) is easily observable through the transparent back lid (61). Preferably, the shape of the damping material sheets (52), (53), (62) and (63) is adapted to the electronic component to be protected.

Figure 8:
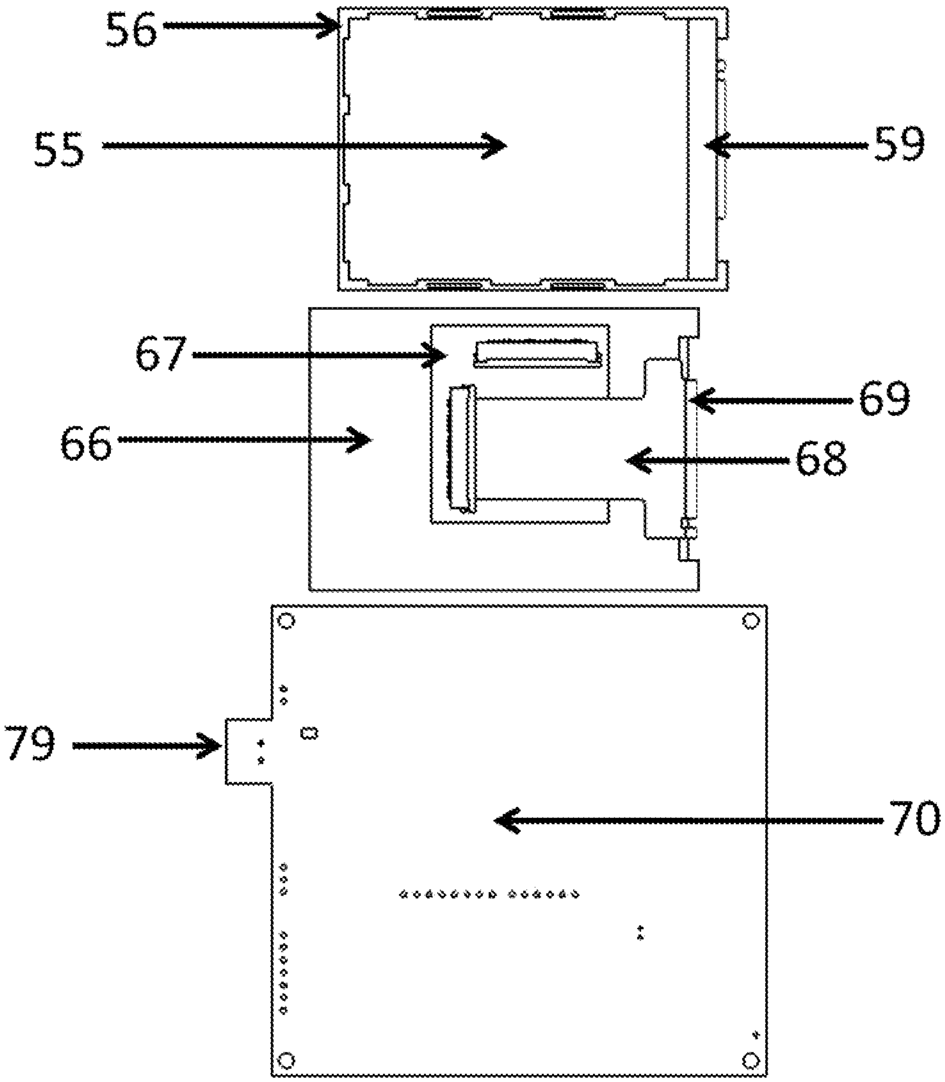
FIG. 8 shows a front view of the assembly components housed within the first enclosure of the bill folder in accordance with the preferred embodiment of the present invention.
Figure 9:
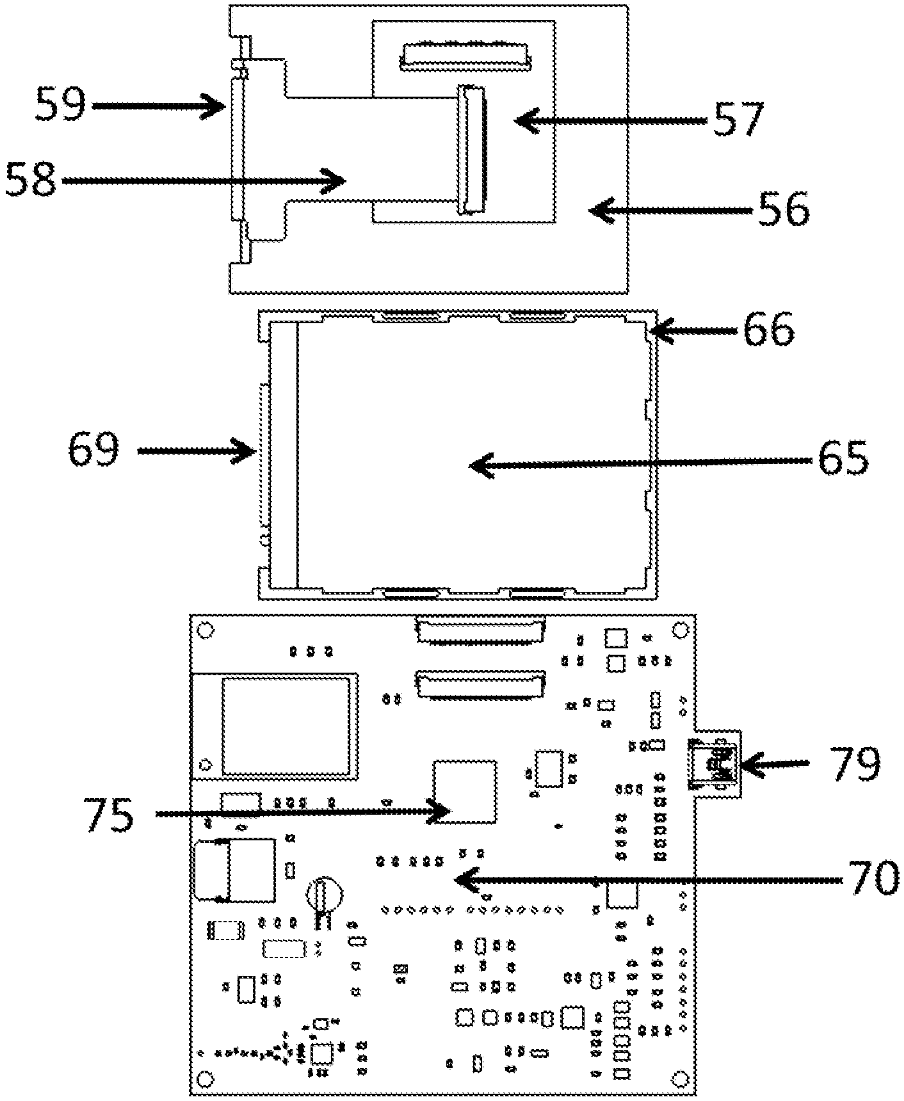
FIG. 9 shows a rear view of the assembly components housed within the first enclosure of the bill folder in accordance with the preferred embodiment of the present invention.

FIGS. 8 and 9 illustrate better the electronic components without the gasket (40) and without the damping material sheets (52), (53), (62) and (63). The visual device (55) has a housing (56) that houses the internal components of said device. Additionally, it has a printed circuit board (57) with a flat wire connector (58) and a connector (59). Similarly, the visual device (65) has a housing (66) that houses the internal components of said device, and also has a printed circuit board (67) with a flat wire connector (68) and a connector (69). The printed circuit boards (57), (67), the flat cable connectors (58), (68), and the connectors (59), (69) control and transmit dynamic information that will be displayed in the visual devices (55) and (65), respectively. The motherboard (70) has a processor (75), a service port (79), as well as other electronic components to be described later. The processor (75) is who controls all the electronic functions of the bill folder.

Figure 10:
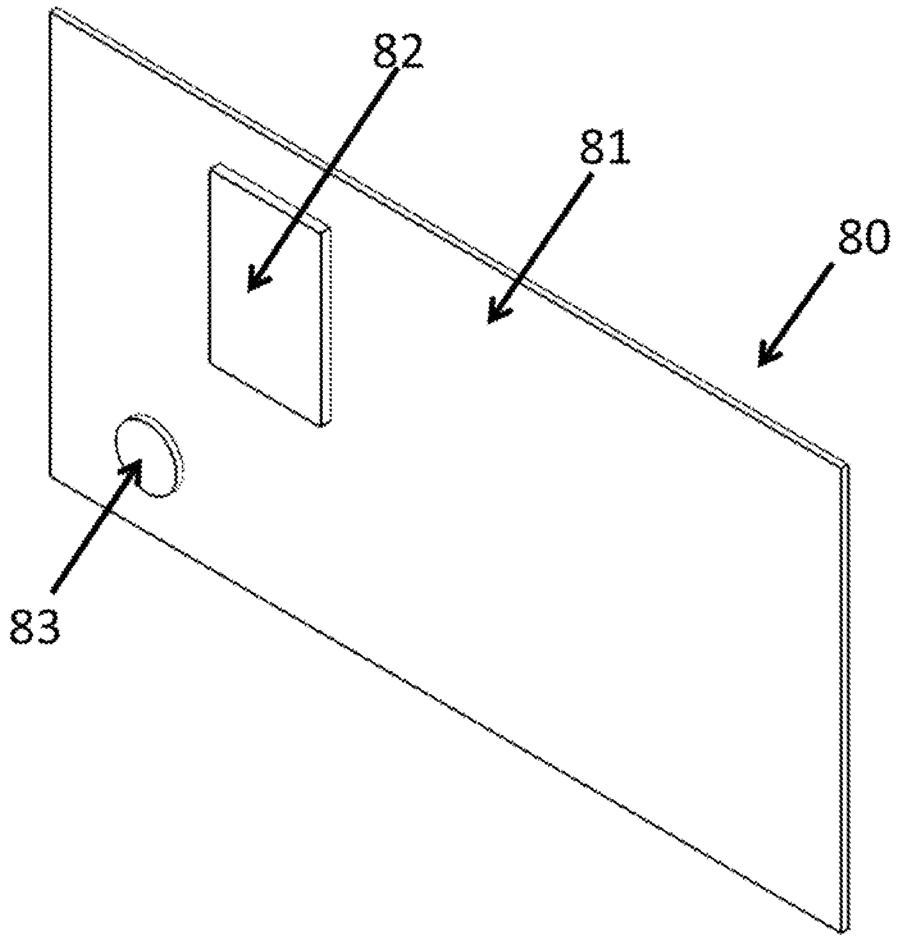
FIG. 10 shows a left front top perspective view of the second enclosure of the bill folder in accordance with the preferred embodiment of the present invention.
Figure 11:
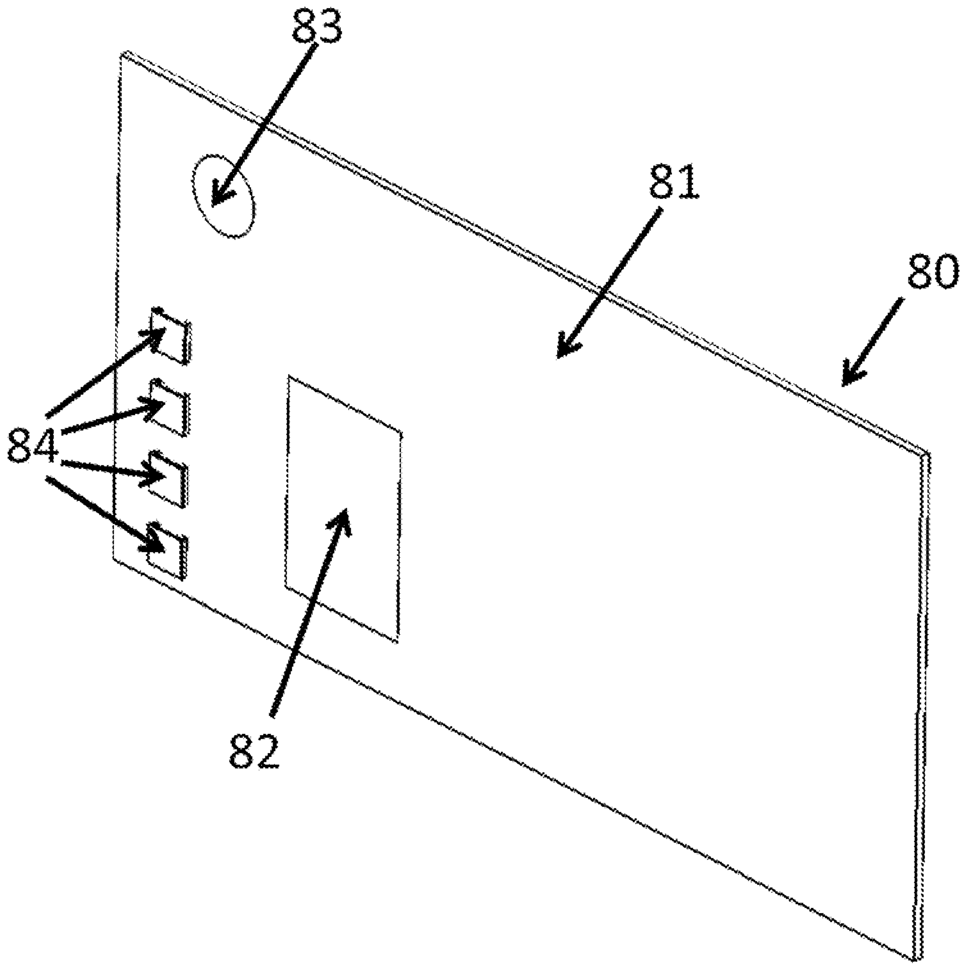
FIG. 11 shows a right rear top perspective view of the second enclosure of the bill folder in accordance with the preferred embodiment of the present invention.

FIGS. 10 and 11 show the second enclosure (80) consisting of a base (81) on which is mounted a battery (82), a sensor (83) and a plurality of charged terminals (84). The charged terminals (84) are overexposed through the coating as shown in FIG. 2 in the counter-lid (31) of the bill folder (10), and are electrically connected to the battery (82). The function of the sensor (83) is to send a signal to the processor if the bill folder (10) is in open or closed position.

Figure 12:
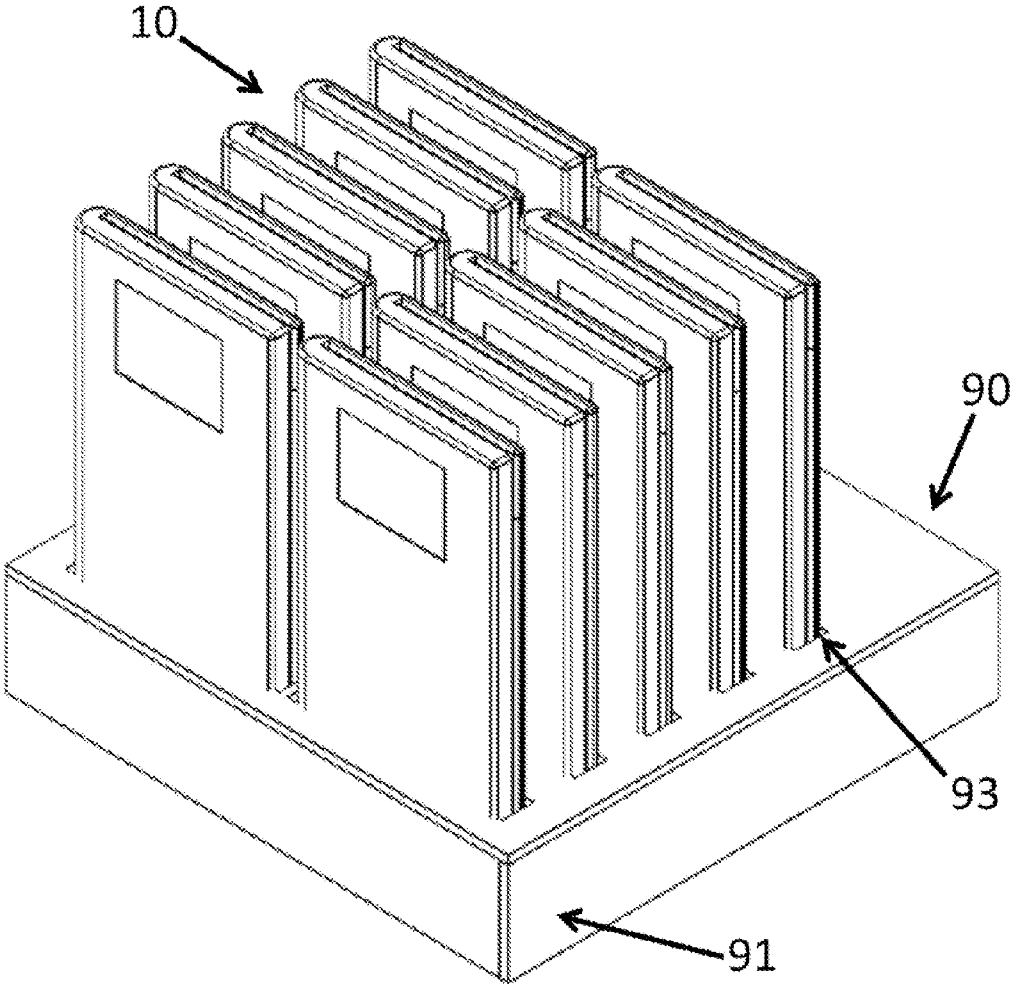
FIG. 12 shows a right front top perspective view of the charger with a plurality of bill folders in accordance with the preferred embodiment of the present invention.
Figure 13:
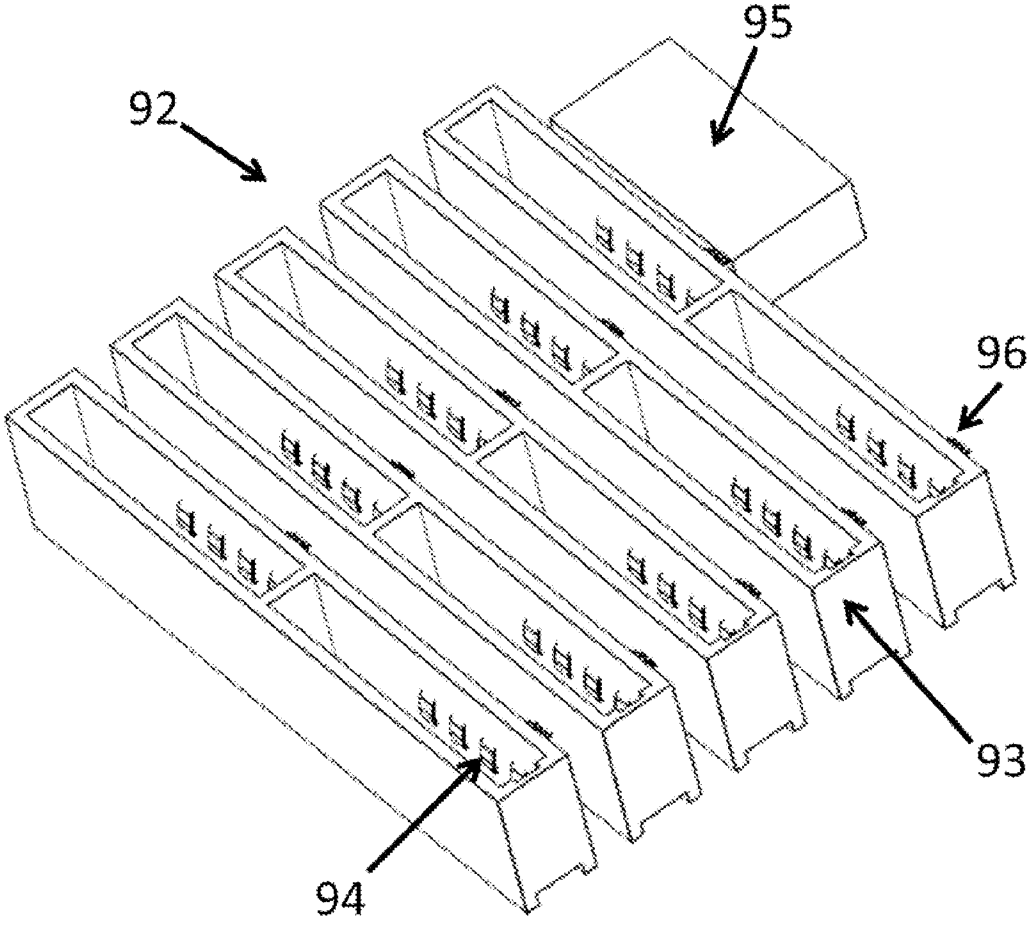
FIG. 13 shows a right front top perspective view of the charger interior assembly in accordance with the preferred embodiment of the present invention.

A collective charger (90) is illustrated in FIG. 12 together with a plurality of bill folders (10) of the present invention. The collective charger (90) has a housing (91) on its upper surface there are a plurality of charging slots (93) where the bill folders (10) are placed. FIG. 13 shows the charger assembly (92) that includes a power source (95) that is electrically connected to each charging slot (93) through a printed circuit board (96) to charging terminals (94) that are coupled and electrically connected with the charged terminals (84) of each bill folder (10). The printed circuit boards (96) control the amount of electric power that must reach to each charged terminal (94). Such collective charger (90) is connected to an external power source, whether public power line or other alternate source.

Figure 14:
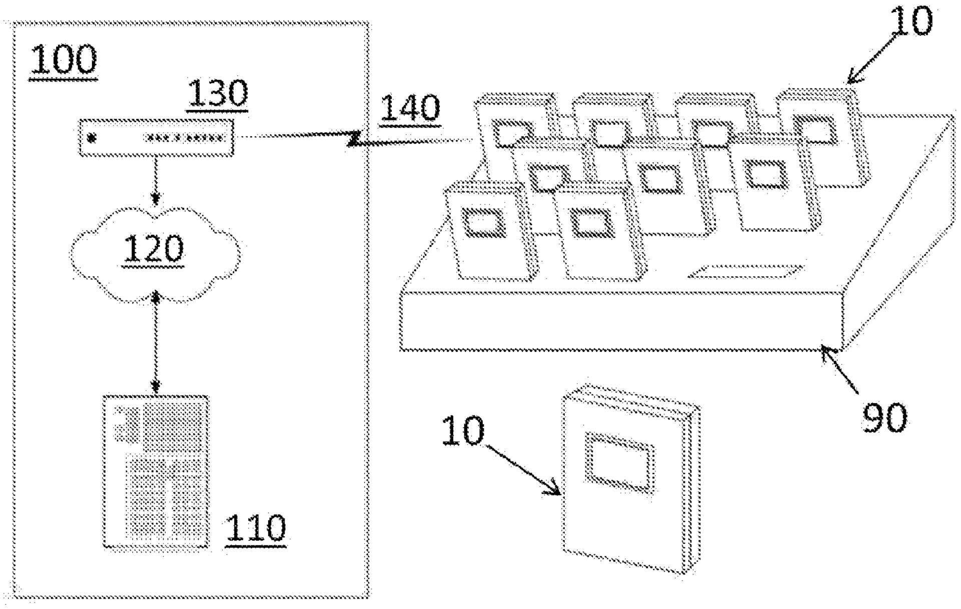
FIG. 14 shows the content updating system in accordance with the first and third preferred embodiments of the present invention.

As described above, the bill folder (10) of the present invention comprises a system capable of reproducing dynamic images in one or more visual devices obtained from a content updating system. FIG. 14 describes the first embodiment of the invention, wherein a content updating system (100) is located at a remote location. The content updating system includes a content server (110) wherein bill folder (10) devices are managed and the information content is selected of each one in accordance with defined variables by the service providers such as: location, regime, level, type of user and type of service. Such content server (110) is connected via internet (120) to one or more access points (130) in the service place. This first embodiment is characterized in that the access point (130) transmits the information to each bill folder via a wireless connection (140).

In a second embodiment of the content updating system of the present invention, the bill folder further includes a port to support an external memory wherein dynamic information has been recorded previously from the content server.

A third embodiment of the content updating system comprises the first embodiment described above but further includes bidirectional communication, wherein the bill folder (10) also sends feedback to the content updating system. Preferably, the feedback consists on statistical information regarding the idle time, utilization time, operation time, time with the guest, number of updates, general system status, as well as the number of times that the bill folder (10) was opened, among many other variables of interest to be measured.

In a fourth embodiment of the content updating system comprises the second embodiment described above but further includes bidirectional communication, wherein the bill folder (10) also stores feedback information in the external memory that goes back to the content updating system. Preferably, the feedback consists on statistical information regarding the idle time, utilization time, operation time, time with the guest, number of updates, general system status, as well as the number of times that the bill folder (10) was opened, among many other variables of interest to be measured.

The described embodiments may also be combined to form a more complete embodiment of the invention.

Figure 15:
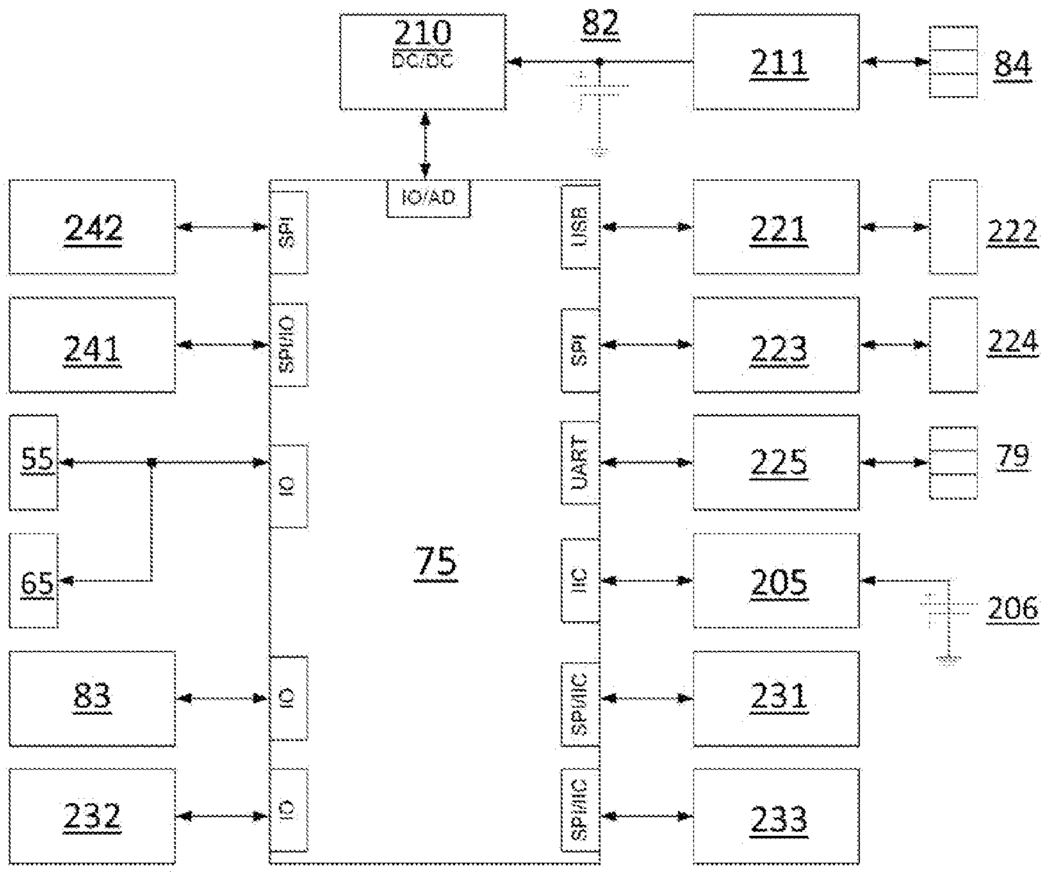
FIG. 15 shows an architecture scheme for the content updating system in accordance with the present invention.

FIG. 15 is a scheme that shows the architecture of the content updating system comprising the various modules that compose the bill folder:

A power module comprising the charged terminals (84) that transmit electric energy to a battery charger (211). The battery charger (211) applies the received energy to the battery (82) through a specialized integrated circuit not shown. Then, a DC/DC converter (210) takes the voltage from the battery (82) and converts it into a stable and regulated voltage for the rest of the system. Preferably, the battery is a prismatic Li-Ion rechargeable battery.

Optionally, a USB communication module comprising a USB interface (221) that controls the communication and enables the power module to couple with any device with this type of interface, such as a USB memory (222), a computer (not shown) or a peripheral device (not shown). In the preferred embodiment illustrated, the USB is a Micro-USB Type B, however may be other configurations as HOST or OTG.

Optionally, a communication module for removable memory card comprising a serial peripheral interface or SPI, which interacts with a memory card interface (223) that controls communication and has means for detachable coupling with a memory card (224). Preferably, the memory card used in the present invention is a SD type. However, the memory card may be any other type of memory card known, such as: Micro-SD, MMC, CF or even using the USB interface in a HOST or OTG configuration is possible to interconnect "flash drives" type storage means.

The system may have an internal memory (not shown) in the case of the first and third embodiments.

A service module (Communication service interface 225) comprising a Universal Asynchronous Receiver/Transmitter or UART, which interacts with a serial interface, preferably for RS232C signal handling via a service port (79). The topology of this port will be without hardware communication protocol, and its use is sporadic for service and debugging.

Optionally, a real time clock module comprising processor internal means for generating a real time clock (205). Such real time clock (205) is controlled by an inter-integrated circuit or IIC, and preferably has an independent power source such that in case of power cut, the clock operation keeps working. In accordance with the second and fourth embodiments described above, the clock stands for cases in which the bill folder (10) does not have access to a communication system that allows to update time automatically, to reproduce scheduled associated images, and to generate usage log. Additionally, real time clock can be external.

Optionally, an accelerometer module comprising an SPI/IIC interface connected to an accelerometer (231). The accelerometer (231) can be employed for detecting vibration and movement of the bill folder (10), or as means of interaction with the user while detecting certain positions.

Optionally, a vibration module comprising a vibration sensor (232) that may replace the accelerometer, but its application is limited to determine if the bill folder (10) is in use and not in idle. This vibration sensor may replace the accelerometer, or may work together to minimize power consumption.

Optionally, a light sensor module comprising an SPI/IIC interface connected to a light sensor (233). The purpose of this light sensor (233) is to measure the ambient light for contrast adjustment of visual devices (55, 65).

Optionally, a opening sensor module comprising the sensor (83) that transmits information to the processor (75) of when the bill folder (10) is opened for turning on the visual device (65) or closed for turning off the visual device (55). Preferably, the sensor is magnetic of hall effect type. However, the sensor (83) can be selected from other type of known opening sensors such as: reed type sensors, magnetic-resistances, optical sensors, proximity sensors, and pressure sensors, among others known.

A visual device module allows the processor to send information to a visual device (55, 65), through the PCB (57, 67). In the preferred embodiment, the visual device module will automatically select the display of information in either the first visual device (55) when the bill folder (10) is in closed position, or the second visual device (65) when the bill folder (10) is in open position. In another embodiment, such visual device module may display information in both visual devices (55, 65) at the same time. In the preferred embodiment, the visual device (55, 65) are color TFT LCD displays with back lighting means. In an alternative embodiment, the visual devices (55, 65) have an integrated graphics controller. In another alternative embodiment, the visual devices (55, 65) do not have an integrated graphics controller which can be integrated into the PCB (57, 67). Notwithstanding the above options, the visual devices (55, 65) may also comprise other display technologies such as the organic light emitting diode or OLED technology, with or without means to implement a "touch-screen" type interaction or e-ink like technologies.

Optionally, a radio module comprising a radio transceiver (242) for providing protection to the bill folder (10) against theft. The radio module allows establishing a link with a beacon placed on the entrance of the service location to determine if any bill folder (10) has left the facility. Preferably, the radio transceiver (242) is 900 MHz for ISM band that will notify the service provider if the product is located outside a predetermined area. The radio transceiver can be calibrated in accordance with each location predetermined area.

According to the above described first and third, a wireless communication module comprising a SPI interface for wireless communication devices. The wireless communication module enables wireless connectivity of the bill folder (10) to the remote content updating system (100) for making modifications to the image files, playlist, as well as the statistics collection available in the log of the third embodiment. In the preferred embodiment is suggested to use WiFi interface.

However, the wireless connection may include bluetooth, infrared, radio frequency, satellite link, and GPRS, among other known wireless connections.

The function of the bill folder (10) of the present invention is described below. During its operation, the bill folder (10) remains at idle until the vibration sensor (232) and/or the accelerometer (231) indicates to the processor (75) that the bill folder (10) is in motion, and therefore in service. When entering service, the bill folder (10) starts the play application of dynamic information in the first visual device (55) located at the lid (21) into the first enclosure (50) protected by the front lid (51). Until the opening sensor (83) sends a signal to the processor that the bill folder (10) has been opened, the processor disables the first visual device (55) and activates the second visual device (65) located on the cover (22) into the first enclosure (50) protected by the back lid (61). If the bill folder (10) is closed again, the opening sensor (83) sends a signal to the processor that the bill folder (10) has been closed so that the processor (75) disables the second visual device (65), and activates again the first visual device (55). If the opening sensor (83) detects an opening again, the processor disables once again the first visual device (55), and activate the second visual device (65). This cycle can be repeated as many times as necessary. Preferably, it is possible to define an activation time where if no motion or use of the bill folder (10) is detected, then it enters in idle mode.

In the first and third embodiments described above, the dynamic information, as well as its programming, are housed in the content server (110) which communicates via internet (120) and an access point (130) with the wireless transmission interface (241) controlled by the processor (75). The server (110) provides dynamic information to any memory available on the bill folder (10), either internal or removable.

Figure 16:
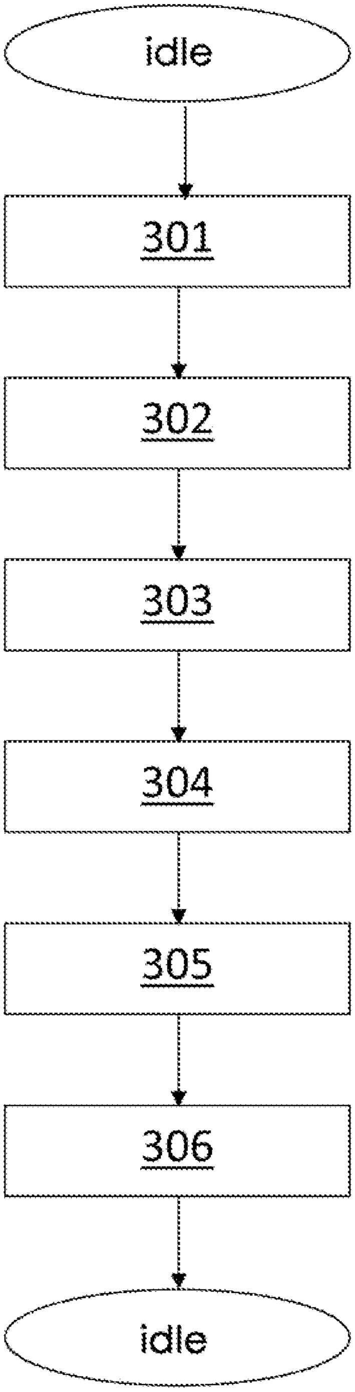
FIG. 16 shows a flow chart of the content updating process in accordance with the first and third preferred embodiments of the present invention.

Internally, the processor (70) is configured to perform the following steps illustrated in FIG. 16: exiting from an idle state to an active state (301), connecting to the content server (302), receiving dynamic information from server (303), deleting previous dynamic information of the corresponding memory (304), overwriting the received dynamic information in the corresponding memory (305), and entering in idle state (306).

In the second and fourth embodiments described above, the dynamic information, as well as its programming, are housed in the content server (110) which is recorded into a removable external storage medium (222, 224). The removable external storage medium (222, 224) is connected to the corresponding port so that the dynamic information reaches the processor (75) through the USB interface (221) or the memory card interface (223), depending on the case.

Figure 17:
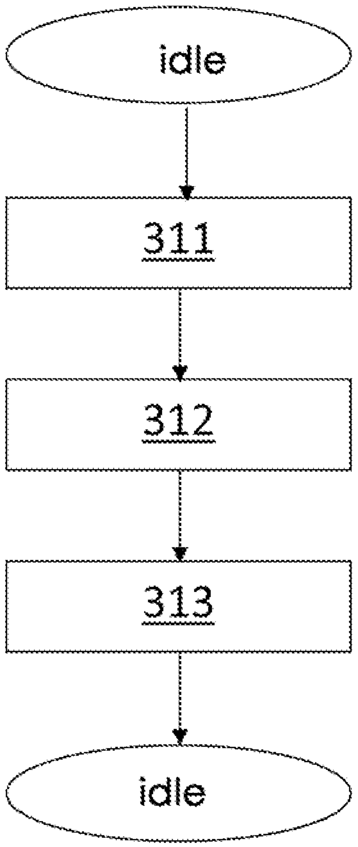
FIG. 17 shows flow chart of the content updating process in accordance with the second and fourth preferred embodiments of the present invention.

Internally, the processor (70) is configured to perform the following steps illustrated in FIG. 17; exiting from an idle state to an active state (311), connecting to the corresponding interface (312), and entering in idle state (313).

Based on the above disclosure, certain embodiments and details have been described to illustrate the present invention and will be apparent to those skilled in the art that variations and modifications can be made without departing from the scope of the present invention.

The invention claimed is:

1. A bill folder, comprising;

a first and second portions that have a coating, the first and second portions have a first and second enclosures, respectively, housed inside, and both portions are coupled by an intermediate hinged portion;

wherein at least one of the enclosures has at least one visual device, a motherboard with a processor that controls all electronic functions of the bill folder, a plurality of modules, one or more memories, and one or more connection interfaces;

wherein the at least one visual device is capable to reproduce dynamic information obtained from a content updating system; and wherein at least one of the enclosures has an accelerometer module configured to detect movement of the bill folder to determine when the bill folder is in use, a light sensor module configured to adjust a brightness level of the at least one visual device automatically according to ambient light conditions, an opening sensor configured to detect when the bill folder is opened to selectively turn on the at least one visual device, and a radio module configured to communicate with a beacon to notify when the bill folder has left a predetermined area.

2. The bill folder in accordance with claim 1, wherein at least one of the enclosures comprises a housing formed by a transparent front lid and a transparent back lid, hermetically sealed and coupled together.

3. The bill folder in accordance with claim 1, wherein the at least one visual device includes at least a first visual device is housed in the first enclosure and a second visual device housed in the second enclosure.

4. The bill folder in accordance with claim 2, wherein the lids are divided into sections suitable for housing electronic components therein, and wherein damping materials sheets are included, which are suitable for protecting the electronic components.

5. The bill folder in accordance with claim 1, wherein one of the enclosures comprises a base on which a battery is mounted electrically connected to a plurality of terminals that are overexposed through the coating of the bill folder, wherein the plurality of terminals are connectable to an electric power charger, and wherein the charger is a collective charger having a housing in which one or more charging slots are located in its upper surface where one or more bill folders are placed, and which interior includes a power source that is electrically connected to each charging slot through a printed circuit board to charging terminals that are adapted to be coupled and electrically connected with the plurality of terminals of each bill folder, wherein the printed circuit boards control the amount of electrical energy to reach every terminal.

6. The bill folder in accordance with claim 1, wherein the content updating system comprises a content server located in a remote location, which manages and selects the dynamic information contents in accordance with defined variables.

7. The bill folder in accordance with claim 1, wherein the bill folder further sends feedback information to the content updating system.

8. The bill folder in accordance with claim 1, further comprising communication means having a USB interface configured to couple with another device having a USB interface.

9. The bill folder in accordance with claim 1, wherein the one or more memories comprises: a port to support an external memory which was previously recorded with dynamic information from the content server, an internal memory, or a communication module for a removable memory card comprising a serial peripheral interface that interacts with a memory card interface that controls communication and has contacts to interface with a removable memory card.

10. The bill folder in accordance with claim 1, further comprising a service module comprises a Universal Asynchronous Receiver/Transmitter, which interacts with a serial interface for RS232C signal handling via a service and debugging port.

11. The bill folder in accordance with claim 1, wherein the bill folder further includes a real time clock module controlled by an inter-integrated circuit, the real time clock module having an independent power source.

12. The bill folder in accordance with claim 1, wherein the accelerometer module comprises an SPI/IIC interface connected to an accelerometer employed for detecting vibration and movement of the bill folder, or as means of interaction with the user while detecting certain positions.

13. The bill folder in accordance with claim 1, further comprising a where vibration module including a vibration sensor configured to determine if the bill folder is in use and not in idle.

14. The bill folder in accordance with claim 1, wherein the light sensor module comprises an SPI/IIC interface connected to a light sensor to measure the ambient light conditions and configured to perform contrast adjustment of the at least one visual device.

15. The bill folder in accordance with claim 1, wherein the content updating system sends information to two or more dynamic visual devices in an exclusive manner, or simultaneously.

16. The bill folder in accordance with claim 1, wherein the one or more connection interfaces comprise a wireless communication module consisting of an SPI interface for wireless communication devices.

17. The bill folder in accordance with claim 1, wherein the processor contains control logic which is configured to:

a) exit from an idle state to an active state;

b) connect to the content server;

c) receive dynamic information from the content server;

d) delete previous dynamic information of the corresponding memory;

e) overwrite the received dynamic information in the corresponding memory; and f) enter in idle state.

18. The bill folder in accordance with claim 1, wherein the processor contains control logic which is configured to:

a) exit from an idle state to an active state;

b) connect to the corresponding interface; and c) enter in idle state.

* * * * *